United States Patent [19]

Schiltz et al.

[11] Patent Number: 5,339,459
[45] Date of Patent: Aug. 16, 1994

[54] HIGH SPEED SAMPLE AND HOLD CIRCUIT AND RADIO CONSTRUCTED THEREWITH

[75] Inventors: Thomas E. Schiltz, Chandler; Carl R. Nuckolls, Fountain Hills, both of Ariz.

[73] Assignee: Motorola, Inc., Schaumburg, Ill.

[21] Appl. No.: 985,477

[22] Filed: Dec. 3, 1992

[51] Int. Cl.$^5$ .......................... H04B 1/28; H03K 5/159
[52] U.S. Cl. ..................................... 455/333; 455/313; 455/318; 307/353
[58] Field of Search ............... 455/313, 318, 323, 319, 455/343, 333, 334, 316; 307/352, 353; 328/151

[56] References Cited

U.S. PATENT DOCUMENTS

| Re. 32,314 | 12/1986 | Gittins et al. | 455/263 |
|---|---|---|---|
| 3,602,825 | 8/1971 | Senior | 307/352 |
| 4,066,919 | 1/1978 | Huntington | 307/353 |
| 4,370,572 | 1/1983 | Cosand et al. | 307/353 |
| 4,389,579 | 6/1983 | Stein | 307/353 |
| 4,612,464 | 9/1986 | Ishikawa et al. | 307/352 |
| 4,801,823 | 1/1989 | Yokoyama | 307/353 |
| 4,806,790 | 2/1989 | Sone | 307/353 |
| 4,910,752 | 3/1990 | Yester, Jr. et al. | 455/343 |
| 4,922,452 | 5/1990 | Larsen et al. | 365/45 |
| 4,970,703 | 11/1990 | Hariharan et al. | 367/138 |
| 5,017,924 | 5/1991 | Guiberteau et al. | 342/195 |

OTHER PUBLICATIONS

An article entitled "Accurately Model Unbiased FETs for Monolithic Switches", by C. Kermarrec et al. of Tachonics Corp., from *Microwaves & RF*, Jun. 1989.
An article entitled "Waveform Sampling with Schottky Diodes" *Hewlett Packard Components Application Bulletin* 16, 5952-9818 (Nov. 1976).
An article entitled "A 1-GHz 6-bit ADC System" by Ken Poulton et al., *IEEE Journal of Solid-State Circuits*, vol. SC-22, No. 6, Dec. 1987, pp. 962-969.
An article entitled "Characterization of Microwave Integrated Circuits Using an Optical Phase-Locking and Sampling System", by H-L. A. Hung et al. of COMSAT Laboratories, Clarksburg, Md., *IEEE MTT-S Digest*, 1991, pp. 507-510.

An article entitled "Computer-Aided Noise analysis of MESFET and HEMT Mixers", by V. Rizzoli et al., *IEEE Transactions on Microwave Theory and Techniques*, vol. 37, No. 9, Sep. 1989, pp. 1401-1410.
An article entitled "Novel GaAs FET Phase Detector Operable to Ka Band" T. Takano et al. Fujitsu Laboratories Ltd., Kawasaki, Japan, *IEEE MTT-S Digest*, 1984, pp. 381-383.
An article entitled "130 GHz GaAs Monolithic Integrated Circuit Sampling Head", by R. A. Marsland et al. of Edward L. Ginzton Laboratory, Stanford University, Stanford, Calif., *1989 American Institute of Physics*, Appl. Phy. Lett. 55(6), 7 Aug. 1989, pp. 592-594.
An article entitled "RF Sampling Gates: a brief review", by N. P. Akers et al., *IEE Proceedings*, vol. 133, Pt. A. No. 1, Jan. 1986, pp. 45-49.

(List continued on next page.)

*Primary Examiner*—Reinhard J. Eisenzopf
*Assistant Examiner*—Nguyen Vo
*Attorney, Agent, or Firm*—Frederick M. Fliegel; Robert M. Handy

[57] ABSTRACT

A sample and hold circuit is formed within an integrated circuit and has a small, substantially linear hold capacitance. The circuit includes a sampling switch, a hold capacitor, and a buffer amplifier. The buffer amplifier includes a common drain FET and a constant current source FET. The common drain FET provides an input which couples to the hold capacitor. The constant current FET isolates the source of the common drain FET from ground. The sample and hold circuit may be used as a wide bandwidth mixer. In a radio application, a pulse generator provides a stream of pulses in which the sampling rate times an integer number equals the RF frequency minus the IF frequency. The width of the sampling pulse is less than the period of an RF signal. In an oscillator application, the sample and hold circuit operates as a mixer in a frequency multiplying phase locked loop.

17 Claims, 3 Drawing Sheets

OTHER PUBLICATIONS

An article entitled "Sampling for Oscilloscopes and Other RF Systems: Dc through X-Band", by W. M. Grove, *IEEE Transactions on Microwave Theory and Techniques,* vol. MTT-14, No. 12, Dec. 1966, pp. 629-635.

An article entitled "Sampling Loops Lock Sources to 23 GHz", *Microwaves & RF,* Sep. 1990.

An article entitled "Subharmonic Sampling for the Measurement of Short-Term Stability of Microwave Oscillators" by N. D. Faulkner et al., *IEEE Transactions on Instrumentation and Measurement,* vol. IM-32, No. 1, Mar. 1983, pp. 208-213.

An article entitled "Sub-Nanosecond Single-Shot Digitizing Using the HP 54111D", *Hewlett Packard Product Note HP 54111D-1,* Mar. 1988.

An article entitled "2.4 GHz MESFET Sampler", by H. Hafdallah et al., Institut d'Electronique Fondamentale, Universite Paris, France, 10th Dec. 1987.

An article entitled "Readout", *Electronic Engineering,* Mar. 1987, pp. 77-79.

FIG. 5

HIGH SPEED SAMPLE AND HOLD CIRCUIT AND RADIO CONSTRUCTED THEREWITH

TECHNICAL FIELD OF THE INVENTION

The present invention relates generally to high speed electronic circuits. More specifically, the present invention relates to a high speed sample and hold circuit and to radios which use such a circuit as a mixer.

BACKGROUND OF THE INVENTION

Conventional radios which detect high frequency RF signals, above 300 MHz for example, or otherwise generate high frequency signals often consume great amounts of power, require a large amount of space, require excessive amounts of individual alignment, are excessively expensive, and suffer from reduced reliability. These problems result, at least in part, from the generation of local oscillator or other oscillation signals at high frequencies.

For example, frequencies of signals used in these applications must often be multiplied by factors in the range of 25-200. One conventional technique for accomplishing the multiplication is through the use of a cascade of step recovery diode multipliers, each of which multiply by a factor of around 2-15. Such multipliers can require up to 16 cubic inches in volume and consume an excess of 2 Watt of power. Another conventional technique for accomplishing the multiplication is through the use of a phase locked loop which requires less space but still requires high power, high speed frequency dividers.

Both of these techniques produce narrow band output signals. With a cascade of step recovery diodes, each cascaded stage must be carefully aligned for operation at a single output frequency, and filters in each stage must be individually tuned to reject undesired harmonics. With a phase locked loop, the tuning range of a voltage controlled oscillator limits the frequency range producible, and this tuning range is typically minimized to reduce phase noise. The need for individual alignment in devices which operate at high frequencies drives up costs by introducing costly manufacturing steps and by introducing opportunities for mistakes and errors in workmanship.

As discussed below, sample and hold circuits may be used in solving at least some of the problems posed by radios which operate at high frequency. An extensive body of technology has developed around utilizing sample and hold circuits in the digital reconstruction of analog signals. Since the majority of this technology requires sampling to occur at a rate which is typically greater than twice the frequency of the signal being sampled, a need has always existed for higher speed sample and hold circuits.

Nevertheless, the performance of conventional sample and hold circuits operating at high frequency microwave RF rates has remained poor. For example, acquisition time and acquisition accuracy have often been too poor to permit the use of sample and hold circuits at higher RF frequencies in any application other than those requiring only very narrow output bandwidths, such as phase detector applications. Moreover, non-linearities in critical parameters, such as hold capacitance, become severe handicaps at higher RF frequencies.

SUMMARY OF THE INVENTION

Accordingly, it is an advantage of the present invention that an improved radio is provided.

Another advantage is that the present invention provides a radio which uses a sample and hold circuit as a mixer, which does not require the generation of a LO signal near an RF frequency, and which uses only a few low-power components.

Another advantage is that the present invention provides an oscillating signal generation circuit which produces a relatively high frequency output signal locked to a relatively low frequency reference signal using only a few low-power components.

Another advantage of the present invention is that an improved sample and hold circuit is provided.

Another advantage is that the present invention provides a sample and hold circuit which exhibits a relatively linear hold capacitance when operated at high RF frequencies.

Another advantage is that the present invention provides a single sample and hold circuit which may be used as either a phase detector or a mixer.

The above and other advantages of the present invention are carried out in one form by an improved radio having a receiver capable of receiving a wideband RF signal. The radio includes an antenna that supplies an RF signal exhibiting an RF frequency. A sample and hold circuit has a sample input that couples to the antenna. A hold output of the sample and hold circuit supplies an IF signal. A pulse generator has an output which couples to a control input of the sample and hold circuit. The pulse generator is configured to produce a stream of pulses at a sampling rate less than the RF frequency. Moreover, the pulse generator is configured so that each of the pulses has a pulse width substantially less than a period for the RF signal.

The above and other advantages of the present invention are carried out in another form by an improved high speed sample and hold circuit. The sample and hold circuit includes a sampling switch that has an input for receiving a signal to be sampled. A hold capacitor couples to an output of the sampling switch. A first transistor is configured in a common drain circuit arrangement and has a gate that couples to the sampling switch output. A second transistor is configured as a substantially constant current source. The second transistor couples to a source of the first transistor.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
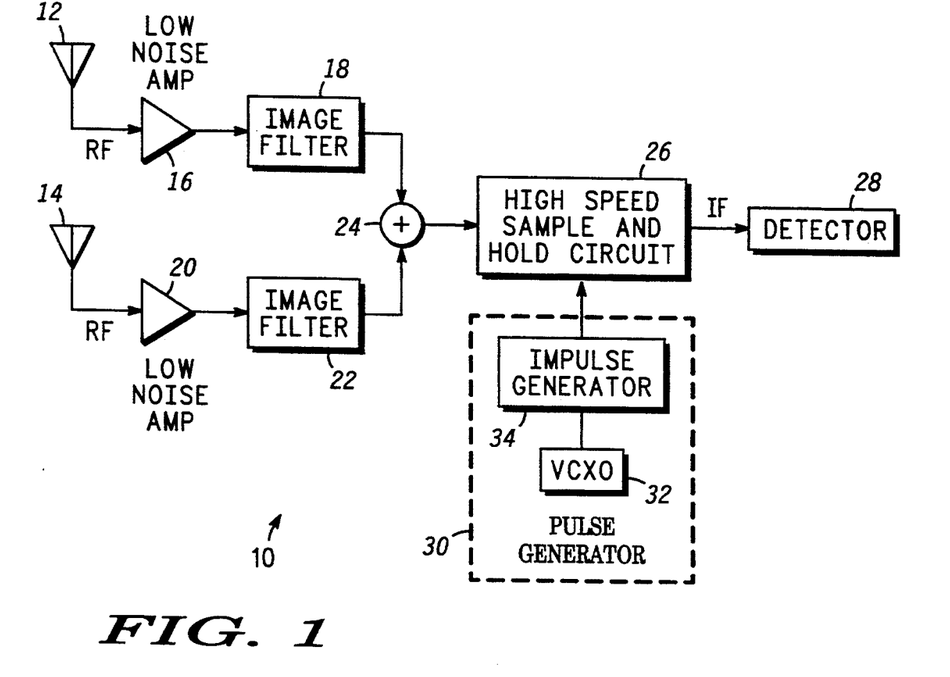
FIG. 1 shows a block diagram of a radio constructed in accordance with the teaching of the present invention.

FIG. 1 shows a block diagram of a radio 10 which converts one or more RF signals into an IF signal and then into a baseband signal. Radio 10 includes an antenna 12, which provides a first RF signal and an optional antenna 14 which provides a second RF signal. In the preferred embodiment, these RF signals exhibit frequencies in excess of 300 MHz, and quite possibly in excess of 1–7 GHz. The present invention may be adapted to operate at lower frequencies, but the numerous advantages of the present invention are pronounced at higher RF frequencies.

An example embodiment is described herein in which the first RF signal exhibits a frequency around 7.49 GHz and the second RF signal exhibits a frequency around 2.21 GHz. Radio 10 downconverts both of these RF signals to an IF signal that exhibits a frequency around 50 MHz. However, those skilled in the art will appreciate that this example embodiment is presented to illustrate and clarify the concepts embodied by the present invention and that the present invention is in no way limited to this example embodiment.

Antenna 12 couples to an input of a low noise amplifier 16, and an output of amplifier 16 couples to an input of an image filter 18. Antenna 14 couples to an input of a low noise amplifier 20, and an output of amplifier 20 couples to an input of an image filter 22. Of course, those skilled in the art will appreciate that an alternate embodiment may be constructed in which a single antenna and RF amplifier drive separate image filters (not shown). As is conventional, image filters 18 and 22 are preferably configured as bandpass filters having center frequencies near the their respective RF frequencies and a bandwidths approximately twice the IF frequency. For the example embodiment, filter 18 has a center frequency at around 7.49 GHz and a bandwidth of around 100 MHz, and filter 22 has a center frequency at around 2.21 GHz and a bandwidth of around 100 MHz. Such filters may be constructed using microwave comb filtering techniques or high dielectric-constant ceramic materials, depending upon the frequencies involved.

The outputs of image filters 18 and 22 couple to a combiner 24, where they are added together. An output from combiner 24 couples to a sample input of a high speed sample and hold circuit 26. Details related to sample and hold circuit 26 are discussed below in connection with FIG. 5. Sample and hold circuit 26 successively samples the filtered RF signals supplied through amplifier 16 and filter 18 and through amplifier 20 and filter 22 to determine an amplitude of the resulting RF signal during the samples. In addition, sample and hold circuit 26 holds sampled amplitudes between successive samples. Sample and hold circuit 26 provides the IF signal at a hold output. In other words, held samples of the RF signal represent the IF signal. The hold output of sample and hold circuit 26 couples to an input of a detector 28. Detector 28 decodes a baseband signal from the IF signal in a manner consistent with an application in which radio 10 is being used. Detector 28 may, for example, decode digital data from the IF signal supplied by the hold output of sample and hold circuit 26.

The IF frequency is determined by characteristics of a pulse stream supplied by a pulse generator 30 to a control input of sample and hold circuit 26. Pulse generator 30 includes an oscillation signal source, such as a voltage controlled crystal oscillator (VCXO) 32. The frequency of oscillator 32 ($f_s$) may be controlled externally (not shown) within a frequency range that is easily, reliably, and inexpensively achievable. In the example embodiment of the present invention, oscillator 32 generates an oscillation signal exhibiting frequencies around 240 MHz. Oscillator 32 couples to an input of an impulse generator 34. Impulse generator 34 generates a pulse having a width ($\tau$) that is less than the period ($T_{rf}$) of the highest RF signal presented to the sample input of sample and hold circuit 26. A stream of sampling pulses at a pulse rate of $f_s$ results. Those skilled in the art will appreciate that impulse generator 34 may be implemented using many different techniques. For example, step recovery diodes and inductor-capacitor (LC) tank circuits may be used, or digital flip-flop circuits with feedback may be used (not shown).

The duration between successive sampling pulses is $T_s$, which equals $1/f_s$ and is approximately 4.167 nanoseconds seconds (ns) in the example embodiment. The duration $\tau$ of the sampling pulse is not a critical parameter in the present invention so long as it remains significantly less than the period of the RF signals being sampled, but is preferably as brief as is reasonably practical. Moreover, the rise and fall times of the sampling pulse are not critical parameters, but are preferably as brief as is reasonably practical.

Sample and hold circuit 26 operates as a downconverter in radio 10. Sample and hold circuit 26 converts a high frequency RF signal into an IF signal in a single operation. Moreover, no local oscillator signal at a frequency near the RF is generated. Rather, local oscillator signals may remain at frequencies less than $\frac{1}{2}$, and preferably significantly less than $\frac{1}{2}$, of the RF. By refraining from generating local oscillator signals at frequencies near the RF signal, power consumption and circuit volume requirements are reduced, and components which otherwise require individual alignment are not needed.

The inclusion of two RF input sources in radio 10 illustrates the wide RF bandwidth nature of radio 10 and of the downconverter provided by sample and hold circuit 26. If radio 10 loses a signal source at one frequency, the input circuitry may be switched so that an entirely different input frequency band is received. A single sample and hold circuit 26 may successfully downconvert from either frequency band.

Figure 2:
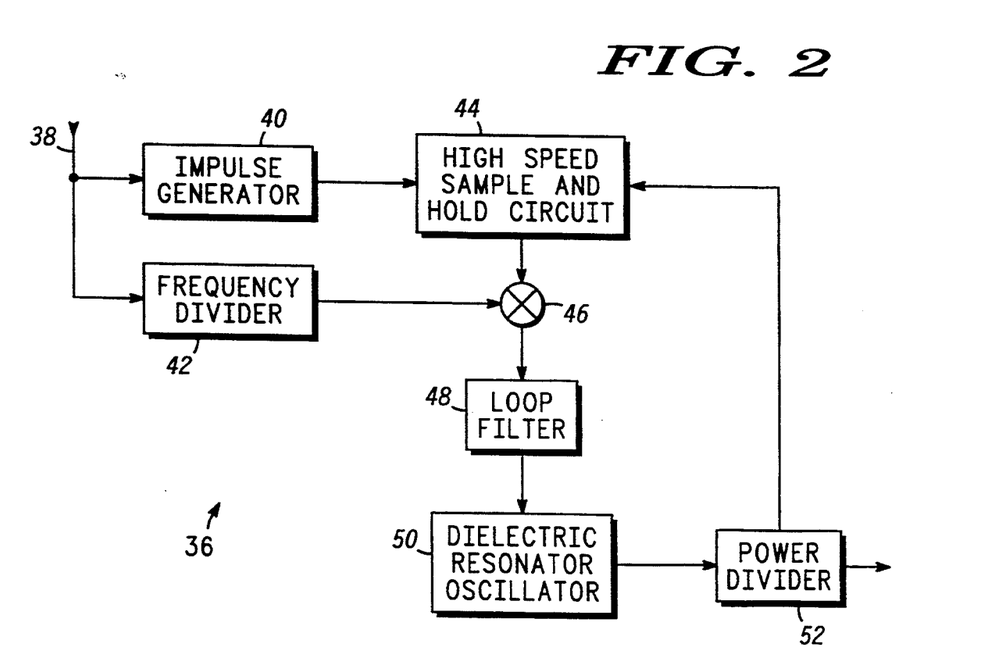
FIG. 2 shows a block diagram of an oscillating signal generation circuit constructed in accordance with the teaching of the present invention.

While FIG. 1 shows a radio 10 in which a local oscillator signal need not operate at or near the RF frequency, FIG. 2 shows an improved oscillation signal generation circuit 36 which generates a high frequency oscillation signal using only a few low power components. Oscillation circuit 36 may, for example, provide a high frequency local oscillation signal which a radio may use in a conventional manner. The oscillation signal provided by the circuit shown in FIG. 2 is locked to an externally supplied relatively low frequency reference signal.

With reference to FIG. 2, the low frequency reference signal is applied to a terminal 38. Terminal 38 couples to an input of an impulse generator 40 and to an input of a frequency divider circuit 42. An output of impulse generator 40 couples to a control input of a high speed sample and hold circuit 44. A hold output of sample and hold circuit 44 couples to a first input of a phase comparator 46, and an output of frequency divider 42 couples to a second input of phase comparator 46. An output of phase comparator 46 couples to an input of a loop filter 48, and an output of loop filter 48 couples to an input of an oscillator 50. An output of oscillator 50 couples to an input of a power divider 52. A first output of power divider 52 couples to a sample input of sample and hold circuit 44, and a second output of power divider 52 provides the oscillation signal generated by oscillation circuit 36.

In general, circuit 36 represents a fractional-frequency synthesizing phase locked loop. Frequency divider 42 provides a fractional multiplication capability which allows the output frequency to differ from an integral multiple of the reference frequency. Impulse generator 40 and sample and hold circuit 44 represent substantially the same structures as are described above in connection with FIG. 1 with reference to impulse generator 34 and sample and hold circuit 26, respectively. Sample and hold circuit 44 also serves as a mixer. In circuit 36, sample and hold circuit 44 multiplies the signal harmonics present in the pulse stream output by impulse generator 40 with the output signal to generate a "product" signal. Oscillator 50 is tuned to oscillate at or near a desired output frequency.

As an example embodiment, oscillator 50 may represent a dielectric resonator oscillator which is configured to resonate at around 8.86 GHz, a reference signal may oscillate at around 120 MHz, and frequency divider 42 may be configured to divide frequency by a factor of 6. The harmonics of the reference signal, as presented in the pulse stream provided by impulse generator 40, are multiplied by the fed-back 8.86 GHz output signal in sample and hold circuit 44. The 74th harmonic of the 120 MHz reference signal has a frequency of 8.88 GHz. Of course, numerous other harmonics are present in the output from impulse generator 40 as well. The 74th harmonic causes sample and hold circuit 44 to produce a 20 MHz product signal. The other harmonics from the pulse stream cause the product signal to additionally include higher frequency components. With frequency divider 42 dividing frequency by a factor of six, a 20 MHz signal is produced. Phase comparator 46 produces a DC output from the 20 MHz components of the signals produced by frequency divider 42 and sample and hold circuit 44. The higher frequency components are filtered off by loop filter 48. A feedback loop forms wherein the output of phase comparator 46 operates around DC to keep the output signal oscillating at 8.86 GHz, locked to the 120 MHz reference signal. Of course, those skilled in the art will appreciate that this example is presented herein for the purposes of explanation and that the present invention is in no way limited to the particular parameters presented in this example.

As will be discussed below, sample and hold circuit 44 has little conversion loss in multiplying the signals presented at its sample and control inputs. Accordingly, even the 74th harmonic of the reference signal causes the output to have significant power. Those skilled in the art will appreciate that filtering and amplification stages may be minimized and even omitted between sample and hold circuit 44 and phase comparator 46, and that only a few low power components are needed.

Figure 3:
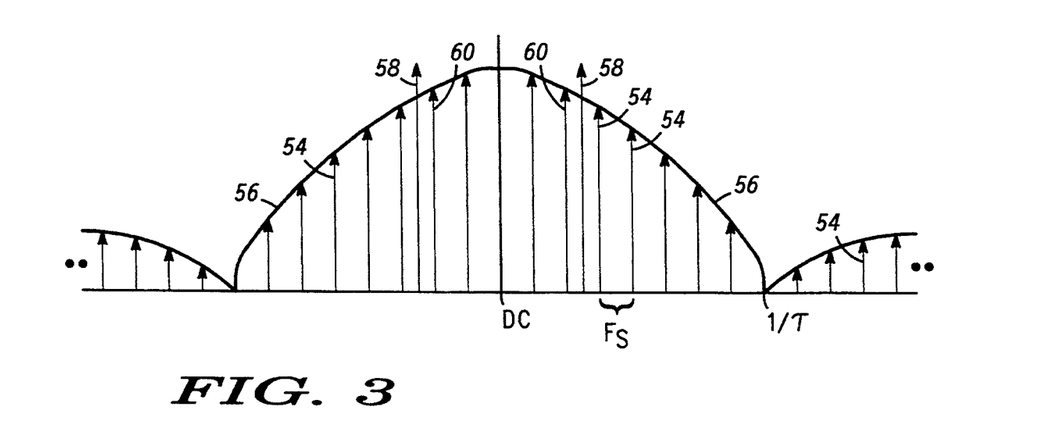
FIG. 3 shows an exemplary spectral diagram depicting a sample pulse spectrum and an RF spectrum.
Figure 4:
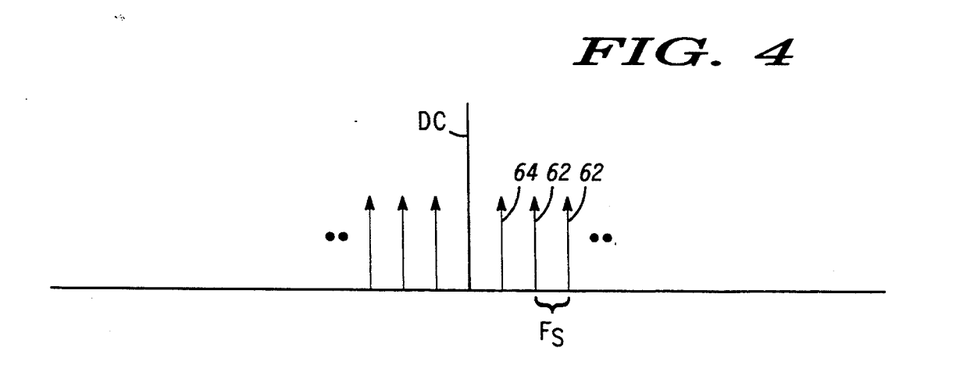
FIG. 4 shows an exemplary spectral diagram depicting the convolution of the sample pulse and RF spectra of FIG. 3.

FIGS. 3-4 graphically illustrate sampling effects in multiplying the signals presented at control and sample inputs of sample and hold circuits 26 (see FIG. 1) and 44 (see FIG. 2). FIGS. 3-4 are presented from the perspective of down converting an RF signal to an IF signal, as shown in FIG. 1. However, those skilled in the art can adopt this teaching to the mixing application shown in FIG. 2 as well.

Sample and hold circuit 26 (see FIG. 1) samples the RF signal while the pulses supplied by pulse generator 30 (see FIG. 1) are active and holds the samples while the pulses are inactive. In other words, sample and hold circuit 26 successively samples the RF signal for a duration of $\tau$ (the pulse width) and holds the sample for the remainder of the duration $T_S$ (the sampling period).

Ignoring the hold effect, in the time domain this sampling process is equivalent to a multiplication of the local oscillator pulse stream with the RF signal. In the frequency domain, it is equivalent to the convolution of the RF spectrum with the spectrum of the local oscillator pulse stream. FIGS. 3-4 graphically show this convolution. The frequency content of the pulse stream consists of a series of impulses 54 at integral multiples of the sampling frequency $f_s$. An amplitude envelope 56 of the pulse stream spectrum follows a $\sin(x)/x$, or $\mathrm{sinc}(x)$, shape, with nulls occurring at integral multiples of $1/\tau$. In general, the IF output frequency spectrum from sampling an RF signal is governed by the general equation:

$$f_{IF}(j2\pi f) = \tau f_s \cdot \left\{ F(j2\pi f_{RF}) + \sum_{n=1}^{\infty} [\mathrm{sinc}(n\pi\tau f_S)] \right\} \cdot \quad \text{Eq. 1}$$

$$\{F[j2\pi(f - nf_S)] + F[j2\pi(f + nf_S)]\}$$

where:
$f_S$ = sampling rate,
$f_{RF}$ = RF frequency,
$\tau$ = sampling pulse duration,
n = an integer harmonic number, and
F (·) = Fourier transform.

Thus, for an IF output near DC, which is usually desired, the pulse stream frequency components that are adjacent to the input RF spectrum will convolve with the RF signal to produce an IF output ($f_{IF}$) centered at:

$$f_{IF} = f_{RF} \pm nf_s \quad \text{Eq. 2}$$

With a sample frequency $f_s$ of 240 MHz, the ninth harmonic (n=9) of the pulse stream spectrum occurs at 2.16 GHz. This ninth harmonic is adjacent to the 2.21 GHz RF input signal discussed above in connection with FIG. 1. Likewise, the thirty-first harmonic (n=31) of the pulse stream spectrum occurs at 7.44 GHz and is adjacent to the 7.49 GHz RF input signal discussed above in connection with FIG. 1. FIG. 3 illustrates the 2.21 GHz RF spectrum at component 58 and the ninth harmonic at impulse 60. Those skilled in the art will understand that numerous harmonics 54 for this example have been omitted from FIG. 3 for clarity of illustration. As shown in FIG. 4, the convolution produces a series of spectral IF components 62, with one IF component 64 occurring near DC and components 62 separated from one another by $f_S$. Those skilled in the art will appreciate that FIG. 4 applies to downconversion of the 7.49 GHz RF signal as well.

Conversion loss describes the signal loss which results from converting an RF signal into an IF signal. To minimize conversion loss of the lowest frequency IF, the Sinc function weighing factor in Eq. 1, presented above, must be as close to unity as possible. In order to keep $f_S$ at frequencies far less than $f_{RF}$, the n and $f_S$ parameters are set by other design considerations. Thus, the sampling pulse width $\tau$ is desirably as brief as possible.

For the example embodiment, conversion loss is around −37.3 dB. However, the holding process performed by sample and hold circuit 26 compensates for this loss while simultaneously attenuating higher frequency components 54. Conversion loss is compensated for because the information obtained during a brief sample is held without substantial attenuation for the remainder of the sampling period $T_S$. Thus, the relative proportion of this information is amplified, roughly by the factor $T_S/\tau$, when compared to other information ignored during the hold period. Higher frequencies are attenuated due to a zero-order hold created by a hold capacitor (discussed below) within sample and hold circuit 26.

Thus, the spectral content of a stream of pulses includes a large number of harmonics. These harmonics mix with the RF signal. Radio 10 (see FIG. 1) uses higher order harmonics from the stream of pulses in lieu of a continuous wave local oscillator signal at or near the RF frequency. One of the higher order harmonics convolves with the RF signal to produce a near DC IF signal. Conversion loss at the desired low frequency IF is compensated for by holding samples, and higher frequency IF spectra produced by convolution with other harmonics from the stream of pulses are attenuated by a zero-order hold.

Figure 5:
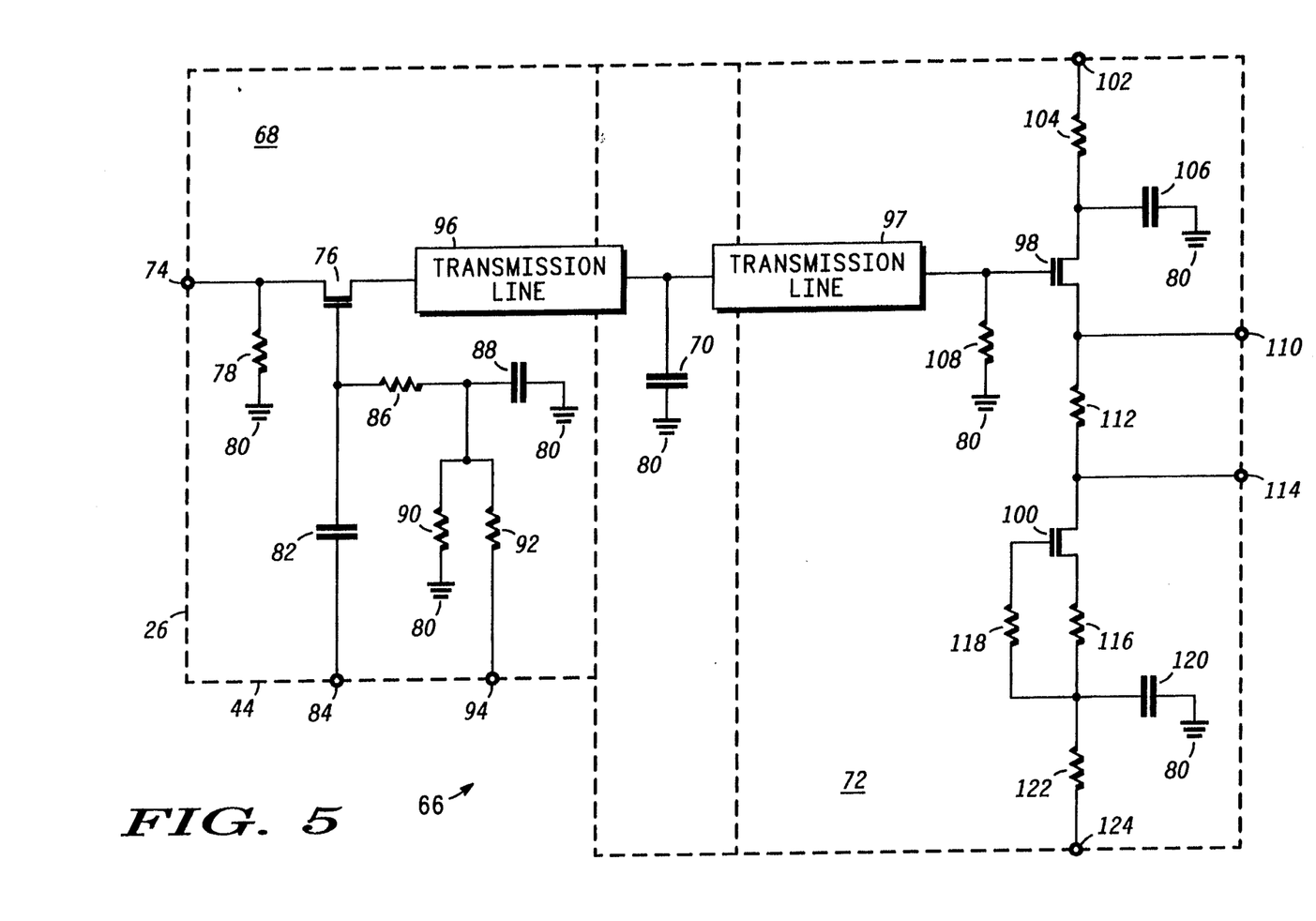
FIG. 5 shows a schematic diagram of a sample and hold circuit.

Sample and hold circuits 26 (see FIG. 1) and 44 (see FIG. 2) have a bandwidth sufficiently wide to accommodate the required IF (see FIG. 1) or product signal (see FIG. 2), that they respectively generate. Unfortunately, conventional sample and hold circuits fail to achieve the bandwidth needed for mixing when IF signals output from sample and hold circuits 26 and 44 occupy a frequency range of many MHz, as in the example embodiments presented above in connection with FIGS. 1 and 2. FIG. 5 shows a schematic diagram of one embodiment of sample and hold circuit 26 that achieves a wide bandwidth and is suitable for use in radio 10. Although, the discussion of FIG. 5 is presented from a perspective of sample and hold circuit 26, the same structure applies to sample and hold circuit 44 as well.

In order to achieve a wide bandwidth, sample and hold circuit 26 is preferably implemented as an integrated circuit. In other words, substantially all components needed by sample and hold circuit 26 reside within a single integrated circuit (IC) 66. In the preferred embodiment, IC 66 is constructed from a gallium arsenide (GaAs) die within an area that is approximately 70 mils by 70 mils, or an area less than 0.005 in². This small area causes transmission lines which carry signals between components within sample and hold circuit 26 to be very short. Consequently, stray capacitances, resistances, and inductances are reduced.

IC 66 includes a sampling switch 68, a hold capacitor 70, and a buffer amplifier 72. Sampling switch 68 includes a contact 74 of IC 66, which serves as the sampling input. In other words, an RF signal is applied to sample and hold circuit 26 at contact 74. Contact 74 couples to a source of a field effect transistor (FET) 76. FET 76 performs the above-discussed sampling of the RF signal. A matching resistor 78, preferably around fifty ohms, couples between contact 74 and a ground terminal 80, which is adapted to receive a common potential. Matching resistor 78 provides for the termination of fifty ohm transmission lines, which are commonly used to transmit high frequency RF signals.

A gate of FET 76 couples through a DC blocking capacitor 82 to a contact 84 of IC 66. Contact 84 serves as the control input for sample and hold circuit 26. In other words, the stream of sampling pulses is applied to sample and hold circuit 26 at contact 84. The gate of FET 76 also couples to a first node of a matching resistor 86, which preferably exhibits around fifty ohms for termination of fifty ohm transmission lines. An AC shorting capacitor 88 and a biasing resistor 90 each couple between a second node of matching resistor 86 and ground terminal 80. A biasing resistor 92 couples between the second node of matching resistor 86 and a contact 94 of IC 66. When a negative potential, around −4 Vdc for example, is applied at contact 94 biasing resistors 90 and 92, bias the gate of FET 76 through matching resistor 86. Capacitor 88 provides an AC ground to the second node of matching resistor 86.

A drain of FET 76 serves as the output of sample switch 68. The schematic diagram of FIG. 5 shows a transmission line 96, which couples sample switch 68 to a first node of hold capacitor 70. The schematic diagram of FIG. 5 also shows a transmission line 97, which couples the first node of hold capacitor 70 and sample switch 68 to an input of buffer amplifier 72. A second node of hold capacitor 70 couples to ground terminal 80.

In the preferred embodiment, hold capacitor 70 exhibits a capacitance of around 1 picoFarad. In general, this capacitance needs to be as small as possible so that acquisition time may be as fast as possible and bandwidth extended as far as possible. On the other hand, hold capacitance preferably exhibits a capacitance which is significantly larger than the parasitic capacitances present at the output of FET 76 and the input of buffer amplifier 72. Such parasitic capacitances associated with active devices are nonlinear. In other words, the capacitance changes depending upon the instantaneous voltages present. Such non-linear capacitances tend to harm the accuracy of samples and decrease the dynamic range of RF signals receivable by radio 10 (see FIG. 1). By forming hold capacitor 70, which exhibits a substantially linear capacitance, to have a capacitance significantly larger than the parasitic capacitances at this node, acquisition accuracy is improved and dynamic range is extended.

Those skilled in the art will appreciate that at the high RF frequencies at which sample and hold circuit 26 may operate, the transmission line characteristics of every connection between components may be significant. However, transmission lines 96 and 97 are shown because their characteristics particularly affect the performance factors controlled by hold capacitor 70. The resistive and inductive characteristics of transmission lines 96 and 97 are reduced by forming sample switch 68, hold capacitor 70, and buffer amplifier 72 in a small area within a common integrated circuit.

The time required for hold capacitor 70 to acquire a sample is determined in large part by the R-C time constant formed by hold capacitor 70 and the "on" resistance of FET 76 in series with transmission line 96. By reducing this resistance, acquisition time is likewise reduced and bandwidth improves. By reducing the inductance of transmission line 96, which couples to hold capacitor 70, second order effects are reduced, and ringing is substantially eliminated. Any ringing or significant second order effects would adversely affect the accuracy of samples recorded at hold capacitor 70.

Buffer amplifier 72 includes a FET 98 and a FET 100. FET 98 is configured in a common drain, or source follower, circuit arrangement. FET 100 is configured as a constant current source. A contact 102 of IC 66 is provided for the receipt of a positive voltage, such as around +4 Vdc. Contact 102 couples through a resistor 104 to a drain of FET 98, and a capacitor 106 couples between the drain of FET 98 and ground terminal 80. A gate of FET 98 serves as the input to buffer amplifier 72. A biasing resistor 108 couples between the gate of FET 98 and ground terminal 80. Preferably, the resistance of resistor 108 is a high value, such as around 1,000,000 ohms, to prevent excessive droop in the voltage acquired by hold capacitor 70 during the hold mode of operation.

A source of FET 98 couples to a contact 110 of IC 66. Contact 110 provides one output from sample and hold circuit 26. In particular, the output provided by contact 110 exhibits a low impedance, such as around 25 ohms, and a slightly positive DC offset. The DC offset may be blocked by AC coupling (not shown) from contact 110 to detector 28 (see FIG. 1). Due to this low impedance output, wideband matching into a fifty ohm transmission line may be easily accomplished, and a high bandwidth is accommodated.

The source of FET 98 additionally couples through a resistor 112 to both the drain of FET 100 and a contact 114 of IC 66. Contact 114 provides a second output of sample and hold circuit 26. The output provided by contact 114 exhibits a higher impedance than the output at contact 110, but occurs at no DC offset. Accordingly, contact 114 is useful for applications where DC coupling is required at lower bandwidths, such as in phase detectors. By providing both high bandwidth and DC coupled outputs, a common IC 66 may serve in many different applications. IC 66 may be used as a mixer, as shown in FIGS. 1 and 2. In addition, IC 66 may be used as a phase detector (not shown).

A source of FET 100 couples to a first node of a resistor 116. A gate of FET 100 couples through a biasing resistor 118 to a second node of resistor 116, and the second node of resistor 116 also couples through a capacitor 120 to ground terminal 80 and through a resistor 122 to a contact 124 of IC 66. Contact 124 permits the application of a negative voltage having a magnitude approximately equal to the positive voltage applied at contact 102.

Resistors 112 and 116 preferably exhibit equal values and are matched due to their formation within a common integrated circuit. Likewise FETs 98 and 100 are configured to be substantially identical to one another. Consequently, when zero voltage is applied at the input of buffer amplifier 72 (the gate of FET 98), a voltage of zero likewise appears at contact 114. Due to the matching, substantially no drifting occurs.

The topology of buffer amplifier 72 contributes to the advantageous performance of sample and hold circuit 26. For example, buffer amplifier 72 provides two diverse outputs at contacts 110 and 114. These two outputs are suited for diverse applications, such as mixing, which requires a high bandwidth, and phase detection, which requires DC coupling.

Moreover, buffer amplifier 72 places an exceedingly low input capacitance in parallel with hold capacitor 70. The gate-to-source parasitic capacitance of a FET is typically significantly greater than the gate-to-drain parasitic capacitance. However, the source of FET 98 is isolated from ground by the high impedance of FET 100, which operates as a constant current source. Since hold capacitor 70 couples between the gate of FET 98 and ground terminal 80, the isolation of the source of FET 98 from ground terminal 80 reduces the parasitic capacitance that the input of buffer amplifier 72 places in parallel with hold capacitor 70. In the preferred embodiment, this parasitic capacitance is on the order of a few tenths of a picoFarad. The non-linearity of these few tenths of a picoFarad does not significantly influence the overall linearity of the hold capacitance of sample and hold circuit 26, and acquisition accuracy improves as a result.

In summary, the present invention provides an improved radio which uses a sample and hold circuit in various mixing applications, such as down conversion and oscillation signal generation circuits. Due to the use of a sample and hold circuit as a mixer, only a single stage is required to down convert a high frequency RF signal to IF, and the radio need not generate a local oscillator signal at or near the RF. The sample and hold circuit used by the preferred embodiment of the present invention exhibits a small but relatively linear hold capacitance when operated at high RF frequencies. Due to the low, linear capacitance, the sample and hold circuit may be accurately operated at high frequencies. Due to the accurate high frequency operation, a high bandwidth results when the sample and hold circuit is used as a mixer. The sample and hold circuit additionally includes an output for DC coupled applications, such as phase detection. Thus, a common part may be used in many diverse applications.

The present invention has been described above with reference to preferred embodiments. However, those skilled in the art will recognize that changes and modifications may be made in these preferred embodiments without departing from the scope of the present invention. For example, those skilled in the art will appreciate that radio and other architectures other than those described herein may utilize a sample and hold circuit as a mixer. In addition, those skilled in the art will understand that the present invention may be applied to virtually any frequency RF and IF signals. These and other changes and modifications which are obvious to those skilled in the art are intended to be included within the scope of the present invention.

What is claimed is:

1. A radio comprising:
   an antenna for supplying an RF signal exhibiting an RF frequency;
   a sample and hold circuit having a sample input coupled to said antenna, having a control input, and having a hold output for supplying an IF signal;
   a pulse generator having an output coupled to said control input of said sample and hold circuit, said pulse generator being configured to produce a stream of pulses at a sampling rate less than said RF frequency and configured so that each of said pulses has a pulse width substantially less than a period of said RF signal; and
   wherein said sample and hold circuit comprises:
      a sampling switch having a first port serving as said sample input, a second port serving as said control input, and a third port;
      a hold capacitor coupled to said third port of said sampling switch; and a buffer amplifier having an input coupled to said third port of said sampling switch and having an output serving as said hold output; and wherein said buffer amplifier comprises:

a first transistor configured in a common drain circuit arrangement, having a gate coupled to said third port of said sampling switch, and having a source and a drain; and a second transistor configured as a constant current source, said second transistor being coupled to said source of said first transistor; and wherein said second transistor has a drain and a source, and said circuit additionally comprises:

a first resistor coupled between said source of said first transistor and said drain of said second transistor, said first resistor exhibiting a first resistance;

a second resistor coupled to said source of said second transistor, said second resistor exhibiting a second resistance which substantially equals said first resistance;

a first terminal for receiving a relatively positive voltage, said first terminal being coupled to said first transistor drain; and a second terminal for receiving a relatively negative voltage, said second terminal being coupled to said second transistor source via said second resistor.

2. A high speed sample and hold circuit comprising:

a sampling switch having an input for receiving a signal to be sampled and having an output;

a hold capacitor coupled to said sampling switch output;

a first transistor configured in a common drain circuit arrangement, having a gate coupled to said sampling switch output and having a source;

a second transistor having a drain and a source, said second transistor configured as a substantially constant current source, said second transistor being coupled to said source of said first transistor, wherein said sampling switch, hold capacitor, first transistor and second transistor each reside within a common integrated circuit;

a first resistor residing within said common integrated circuit and being coupled between said source of said first transistor and said drain of said second transistor;

a second resistor residing within said common integrated circuit and being coupled to said source of said second transistor;

a first external contact of said common integrated circuit coupled to said source of said first transistor; and a second external contact of said common integrated circuit coupled to said drain of said second transistor.

3. In a system comprising a sampling switch, a hold capacitor and a buffer amplifier, wherein:

said sampling switch comprises an input for receiving a signal to be sampled, an output and a sampling signal input port coupled to a pulse generator for receiving a stream of pulses at a sampling rate;

said hold capacitor is coupled to said sampling switch output; and said buffer amplifier comprises a first transistor configured in a common drain circuit arrangement, having a gate coupled to said output of said sampling switch and having a source and a drain, and a second transistor having a drain and a source, said second transistor being configured as a constant current source coupled via a first resistor exhibiting a first resistance coupled between said source of said first transistor and said drain of said second transistor, a second resistor coupled to said source of said second transistor, said second resistor exhibiting a second resistance which substantially equals said first resistance, a first terminal for receiving a relatively positive voltage, said first terminal coupled to said first transistor drain, a second terminal for receiving a relatively negative voltage, said second terminal coupled to said second transistor source via said second resistor, a method for generating an IF signal exhibiting an IF frequency, said method comprising steps of:

supplying an RF signal exhibiting an RF period to said input of said sampling switch;

successively sampling, in response to said stream of pulses coupled to said sampling signal input port, said RF signal by said sampling switch to generate a stream of RF samples, said sampling rate causing less than one sample to be taken per RF period, and said sampling occurring for each sample over a duration which is substantially less than said RF period; and holding by said hold capacitor, each of said RF samples between successive ones of said samples.

4. A radio as claimed in claim 1 wherein said pulse generator is further configured so that said sampling rate is less than approximately one-half of said RF frequency.

5. A radio as claimed in claim 1 wherein said pulse generator is further configured so that said sampling rate times an integer number substantially equals said RF frequency plus or minus an IF frequency of said IF signal.

6. A radio as claimed in claim 1 additionally comprising an image filter coupled between said antenna and said sample and hold circuit.

7. A radio as claimed in claim 1 wherein said sampling switch, said hold capacitor, and said buffer amplifier are all formed within a common integrated circuit.

8. A radio as claimed in claim 1 wherein each of said sampling switch, said hold capacitor, and said buffer amplifier are formed on a common GaAs die.

9. A radio as claimed in claim 1 wherein said third port of said sampling switch, said input of said buffer amplifier, and at least a portion of said hold capacitor reside within an area less than five-thousandths of a square inch.

10. A radio as claimed in claim 1 wherein:

said sample and hold circuit additionally comprises a terminal which is adapted to receive a common potential;

said hold capacitor additionally couples to said terminal;

said buffer amplifier exhibits an input capacitance between said buffer amplifier input and said terminal; and said hold capacitor is configured to exhibit a capacitance substantially greater than said buffer amplifier input capacitance.

11. A high speed sample and hold circuit as claimed in claim 2 wherein said first transistor additionally has a drain, said first and second resistors exhibit substantially equivalent resistances, and said circuit additionally comprises:

a third external contact of said common integrated circuit for receiving a relatively positive voltage, said third external contact being coupled to said first transistor drain; and a fourth external contact of said common integrated circuit for receiving a relatively negative voltage, said fourth external contact being coupled to said source of said second transistor via said second resistor.

12. A high speed sample and hold circuit as claimed in claim 11 additionally comprising:

a terminal within said common integrated circuit which is adapted to receive a common potential;

a first biasing resistor included within said common integrated circuit and being coupled between said gate of said first transistor and said terminal; and a second biasing resistor included within said common integrated circuit and being coupled between said gate of said second transistor and said fourth external contact of said common integrated circuit.

13. A high speed sample and hold circuit as claimed in claim 2 wherein:

said circuit additionally comprises a terminal within said common integrated circuit which is adapted to receive a common potential;

said hold capacitor additionally couples to said terminal;

said common drain circuit arrangement exhibits an input capacitance between said gate of said first transistor and said terminal; and said hold capacitor is configured to exhibit a capacitance substantially greater than said input capacitance.

14. A high speed sample and hold circuit as claimed in claim 2 wherein said sampling switch, said hold capacitor, said first transistor, and said second transistor all reside within an area less than five-thousandths of a square inch.

15. A method as claimed in claim 3 wherein said sampling step causes said sampling rate to be less than approximately one-half of said RF frequency.

16. A method as claimed in claim 3 wherein said sampling step is configured so that said sampling rate times an integer number substantially equals a frequency of said RF signal minus said IF frequency.

17. A high speed sample and hold circuit as claimed in claim 2 wherein said common integrated circuit is formed on a common GaAs die.

* * * * *